(12) United States Patent
Viswanathan et al.

(10) Patent No.: US 10,082,531 B2
(45) Date of Patent: Sep. 25, 2018

(54) ELECTRICAL MACHINE COMPONENT FAILURE DETECTION APPARATUS AND METHOD

(71) Applicant: ROLLS-ROYCE plc, London (GB)

(72) Inventors: Vaiyapuri Viswanathan, Singapore (SG); Sivakumar Nadarajan, Singapore (SG); Amit K. Gupta, Singapore (SG)

(73) Assignee: ROLLS-ROYCE plc, London (GB)

( * ) Notice: Subject to any disclaimer, the term of this patent is extended or adjusted under 35 U.S.C. 154(b) by 0 days.

(21) Appl. No.: 15/347,499

(22) Filed: Nov. 9, 2016

(65) Prior Publication Data

US 2017/0160330 A1 Jun. 8, 2017

(30) Foreign Application Priority Data

Dec. 4, 2015 (GB) .................................. 1521408.3

(51) Int. Cl.
*G01R 31/02* (2006.01)
*H02P 9/14* (2006.01)
(Continued)

(52) U.S. Cl.
CPC ............. *G01R 31/02* (2013.01); *G01R 31/34* (2013.01); *H02P 9/14* (2013.01); *H02P 29/0241* (2016.02)

(58) Field of Classification Search
CPC ............... H02J 1/10; H02M 7/06; H02M 7/08
See application file for complete search history.

(56) References Cited

U.S. PATENT DOCUMENTS 4,952,915 A  8/1990 Jenkins et al.
6,956,459 B2 10/2005 Lau et al.
(Continued)

FOREIGN PATENT DOCUMENTS

EP   2 905 630 A2   8/2015
EP   2 908 148 A2   8/2015
JP   2002-051560 A  2/2002

OTHER PUBLICATIONS

Aug. 4, 2017 Search Report issued in European Patent Application No. 16198003.2.
(Continued)

*Primary Examiner* — Muhammad S Islam
(74) *Attorney, Agent, or Firm* — Oliff PLC

(57) ABSTRACT

A rectifier diode failure detection apparatus for an electrical machine (10), the electrical machine (10) comprising an exciter armature winding (28a-c), a rotor main field winding (24) and first and second rectifiers (34a, 34b) arranged in parallel, each rectifier (34a, 34b) comprising at least first and second diodes (38a, 38b), each rectifier being configured to independently supply the rotor main field winding (24) with DC electrical current, the failure detection apparatus comprising:

a controller (40) comprising at least two current sensors (42a, 42b), each current sensor (42a, 42b) being configured to measure output current ($I_{f1}$, $I_{f2}$) of a respective one of the rectifiers (34a, 34b), and the controller (40) being configured to determine a harmonic of the measured rectifier output currents; the controller (40) being further configured to determine a ratio of the magnitude of the first rectifier (34a) output current harmonic to the magnitude of the second rectifier (34b) output current harmonic, wherein the controller (40) is configured to determine that a fault has occurred in one of the rectifier diodes (38a, 38b) where the ratio exceeds a threshold value.

8 Claims, 2 Drawing Sheets

(51) Int. Cl.
    *G01R 31/34*     (2006.01)
    *H02P 29/024*    (2016.01)

(56) References Cited

U.S. PATENT DOCUMENTS

| | | | |
|---|---|---|---|
| 2011/0216449 A1* | 9/2011 | Reschovsky | H02H 9/00 361/18 |
| 2011/0295558 A1* | 12/2011 | Fish | H02P 29/68 702/184 |
| 2013/0155729 A1 | 6/2013 | Lee | |
| 2015/0198668 A1* | 7/2015 | Viswanathan | G01R 31/343 322/99 |
| 2016/0322924 A1* | 11/2016 | Oriol | H02P 9/105 |

OTHER PUBLICATIONS

May 12, 2016 Search Report issued in British Patent Application No. 1521408.3.
Salah, Mohamed et al. "Detection of Brushless Exciter Rotating Diodes Failures by Spectral Analysis of Main Output Voltage". Unity of Research in Control, Monitoring and Reliability of the Systems Higher School of Sciences and Technologies of Tunis, 2013.
J. Lewis Blackburn, Symmetrical Components for Power Systems Engineering, Marcel Dekker, New York (1993).

* cited by examiner

ELECTRICAL MACHINE COMPONENT FAILURE DETECTION APPARATUS AND METHOD

The present disclosure concerns an electrical machine rectifier diode detection apparatus, and a method of detecting failure of a rectifier diode of an electrical machine.

Brushless electrical machines such as generators and motors are known. Such machines have the advantage over traditional electrical machines in that no commutator or slip ring is used, which may otherwise wear, resulting in failure of the machine.

The Brushless Synchronous Generator (BLSG) is one type of brushless electrical machine. These are found in many applications such as power generators for aircraft and marine vessels. Brushless Synchronous Motors (BLSM) are also known. Frequently, such applications require high reliability, and accurate detection of failure.

A BLSG comprises a stator comprising at least one main winding, and a rotor which comprises at least one rotor winding. When operated as a generator, the main winding generates electrical power, which is provided to an electrical load. In order to energise the rotor winding, a rotating transformer known as an exciter is provided. The exciter comprises a static exciter field winding and a rotating exciter armature winding (also known as a three-phase rotor field winding, or an excitation armature winding). DC current is supplied to the static exciter field winding, which is then transferred electromagnetically to the rotating exciter armature winding, thereby inducing an AC current in the rotating exciter armature winding. A rotating rectifier mounted on the same shaft as the rotor then converts the AC current in the rotating exciter armature winding to provide DC electrical current to the rotor main winding. Similar arrangements are also known for synchronous electric motors, wherein electrical power is provided to the main stator windings, which thereby produce a rotating magnetic field, which interacts with the rotating magnetic field on the rotor winding, to impart a torque on the rotor.

Consequently, it is essential that the rectifier functions correctly, to thereby energise the rotor winding, and allow the main stator winding to provide electrical power (or to operate as a motor when supplied with electrical power).

Since the rotor rectifier is essential for operation, in many cases, the rectifier comprises redundant electrical components. In a parallel redundant rectifier topology, the rectifier arrangement has redundant first and second rectifiers. Each of the first and second rectifiers is rated to provide the full rating of the machine, such that failure of one rectifier will allow operation to continue. The rectifier is a three-phase uncontrolled bridge rectifier which has six diodes to provide full-wave rectification. However, consequently, failure of one rectifier (in particular either an open circuit or a short circuit failure of one or more of the diodes of each rectifier) will result in a "silent failure" of the machine, such that the machine is then susceptible to a single point failure should a further component fail. In many safety critical applications, such a silent failure is unacceptable.

Consequently, there is a desire to provide an apparatus and a method for detecting failure of a diode of a rotating rectifier.

One proposed method for detecting failure of a rectifier diode of an electrical machine is disclosed in U.S. Pat. No. 4,952,915. This includes a detection circuit for each diode of the rotating rectifier. Such an arrangement is highly complex, and may itself be subject to undetected failure.

US20110216449 discloses a similar method, which comprises providing a voltage sensor across each pair of series diodes, thereby requiring twelve voltage sensors in all. Again therefore, this method requires providing extensive electronics to detect failure of each electronic component of the rectifier.

U.S. Pat. No. 6,956,459 discloses a fuse element with a pop-out indicator. However, this method will fail to detect a broken or loose connection external to a diode, which will have the same effect as an open diode even though the diode itself has not failed open. Consequently, this method cannot detect all types of diode failure.

"Detection of Brushless Exciter Rotating Diodes Failures by Spectral Analysis of Main Output Voltage", by Mohamed Salah et al, published in 2013 the International Conference on Electrical Engineering and Software Applications (ICEESA) on 21-23 Mar. 2013 proposes a further method of detecting diode failure. In this method, the main output voltage of the main stator windings is monitored, and a harmonic analysis is performed on the resultant main stator winding output voltage. However, such a method has been found by the inventors to provide an unreliable indicator of parallel redundant diode faults, in view of the very short period of the resultant signature.

Applicant's own disclosures EP 2905630 and EP 2908148 propose further methods for detection of diode failure in rotating rectifiers of electrical machines. In EP2905630, a method and apparatus for detecting the occurrence of diode failure in an exciter rotating rectifier is provided, wherein small resistors are connected in series with each phase of an exciter armature winding and measured voltage drops across each resistor are used to detect the diode failure based on a proposed algorithm. A processor attached to the rotor can detect and isolate the failure of rotating diodes based on the proposed algorithm. Another algorithm is proposed based on the harmonic analysis of exciter armature current for the fast and accurate detection of exciter rotating diode failures.

In EP 2908148, a method and apparatus for detecting the occurrence of diode failure in an exciter rotating rectifier is discussed, wherein voltage sensors and self-powered current sensors are used to measure phase voltages and currents of an exciter armature, which is then used to detect the diode failure based on a proposed algorithm. A computational unit attached to the rotor can detect and isolate the failure of rotating diodes based on the proposed algorithm. This method is based on the measurements of the positive sequence third harmonic components of exciter armature voltages and currents, and obtains a positive sequence third harmonic admittance for the fast detection of the rotating rectifier failure. However, the diode failure detection method proposed in both EP2905630 & EP 2908148 are able to detect the diode failure in an exciter with only a single rectifier bridge per phase. In high power electrical generators, many rotating rectifier bridges are connected in parallel. The above described methods cannot be used to reliably detect the diode failure in a parallel redundant topology due to unreliable fault signatures.

Consequently, it is an aim of the present invention to provide an electrical machine rectifier diode failure detection apparatus and a method of detecting failure of a rectifier diode of an electrical machine having a parallel redundant bridge rectifier topology which is reliable, accurate, and requires a minimum of additional sensing equipment.

According to a first aspect of the invention there is provided a rectifier diode failure detection apparatus for an electrical machine, the electrical machine comprising an exciter armature winding, a rotor main field winding and first and second rectifiers arranged in parallel, each rectifier comprising at least two rectifier diodes, each rectifier being configured to independently supply the rotor main field winding with DC electrical current, the failure detection apparatus comprising:

a controller comprising at least two current sensors, each current sensor being configured to measure output current of a respective one of the rectifiers, and the controller being configured to determine a harmonic of the measured rectifier output currents; the controller being further configured to determine a ratio of the magnitude of the first rectifier output current harmonic to the magnitude of the second rectifier output current harmonic, wherein the controller is configured to determine that a fault has occurred in one of the rectifier diodes where the ratio is not equal to a threshold value.

Consequently, by measuring only the output current of each rectifier in an electrical machine comprising a redundant parallel rotor rectifier topology, it is possible to detect a failure of one of the rectifier diodes. Consequently, in one example, only two current sensors are required, in contrast with the twelve that are required by some prior methods. Furthermore, it has been found that the ratio of the magnitude of the first rectifier output current harmonic to the magnitude of the second rectifier output current harmonic provides a reliable, easy to measure indicator of rectifier diode failures. In general, a single current sensor is required per parallel redundant rectifier.

The measured harmonic of each rectifier output current may comprise a fundamental or higher harmonic, and preferably comprises one of the third harmonic and the sixth harmonic.

The controller may further comprise a wireless transmitter configured to transmit a failure indication to a wireless receiver located remotely from the rotating rectifier.

The controller may be further configured to determine a ratio of a magnitude of a DC component of the first rectifier output current to a magnitude of a DC component of the second rectifier output current, and to determine that a rectifier diode of the second rectifier has failed where the ratio is not equal to unity for a predetermined period of time, and that a rectifier diode of the first rectifier has failed where the ratio is less than unity for a predetermined period of time. Advantageously, the apparatus can be used to determine which rectifier has failed, while still only using two current sensors in the case of a system comprising two rectifiers.

A first current sensor may be coupled to an anode side of diode bridges of the first rectifier, while a second current sensor may be coupled to a cathode side of diode bridges of the second rectifier.

According to a second aspect of the present invention, there is provided a method of determining failure of an electrical machine diode rectifier, the electrical machine comprising an exciter armature winding, a rotor main field winding and first and second rectifiers arranged in parallel, each rectifier comprising at least two rectifier diodes, each rectifier being configured to independently supply the rotor main field winding with DC electrical current, the method comprising: measuring output current of each of the rectifiers, determining a harmonic of each rectifier output current; and determining a ratio of the magnitude of the first rectifier output current harmonic to the magnitude of the second rectifier output current harmonic, wherein the method comprises determining that a fault has occurred in one of the rectifier diodes where the ratio is not equal to a threshold value.

The method may further comprise determining a ratio of a magnitude of a DC component of the first rectifier output current to a magnitude of a DC component of the second rectifier output current, and determining that the second rectifier has failed where the ratio is not equal to than unity for a predetermined period of time, and that the first rectifier has failed where the ratio is less than unity for a predetermined period of time.

The skilled person will appreciate that except where mutually exclusive, a feature described in relation to any one of the above aspects of the invention may be applied mutatis mutandis to any other aspect of the invention.

An embodiment of the invention will now be described by way of example only, with reference to the Figures, in which.

Figure 1:
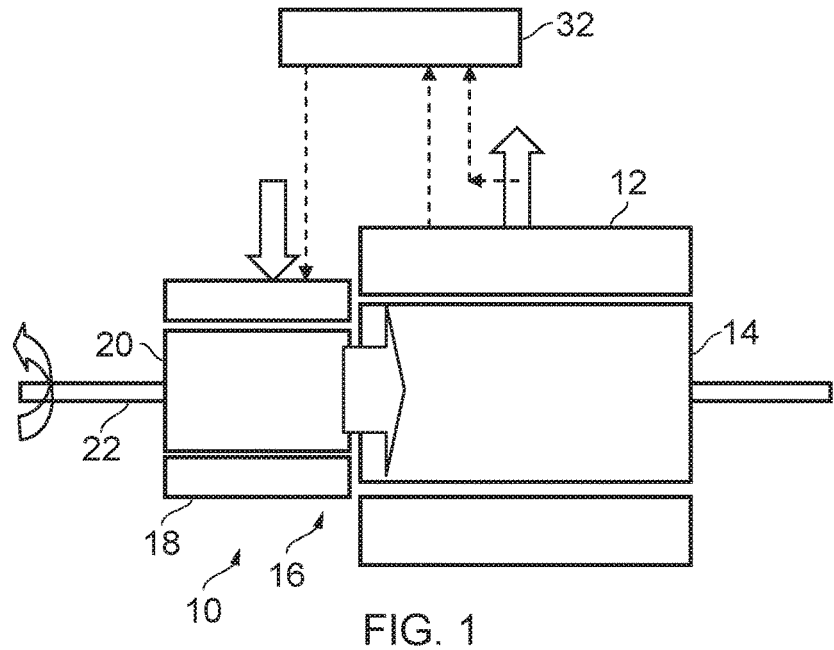
FIG. 1 is a schematic view of a brushless synchronous electrical machine.
Figure 2:
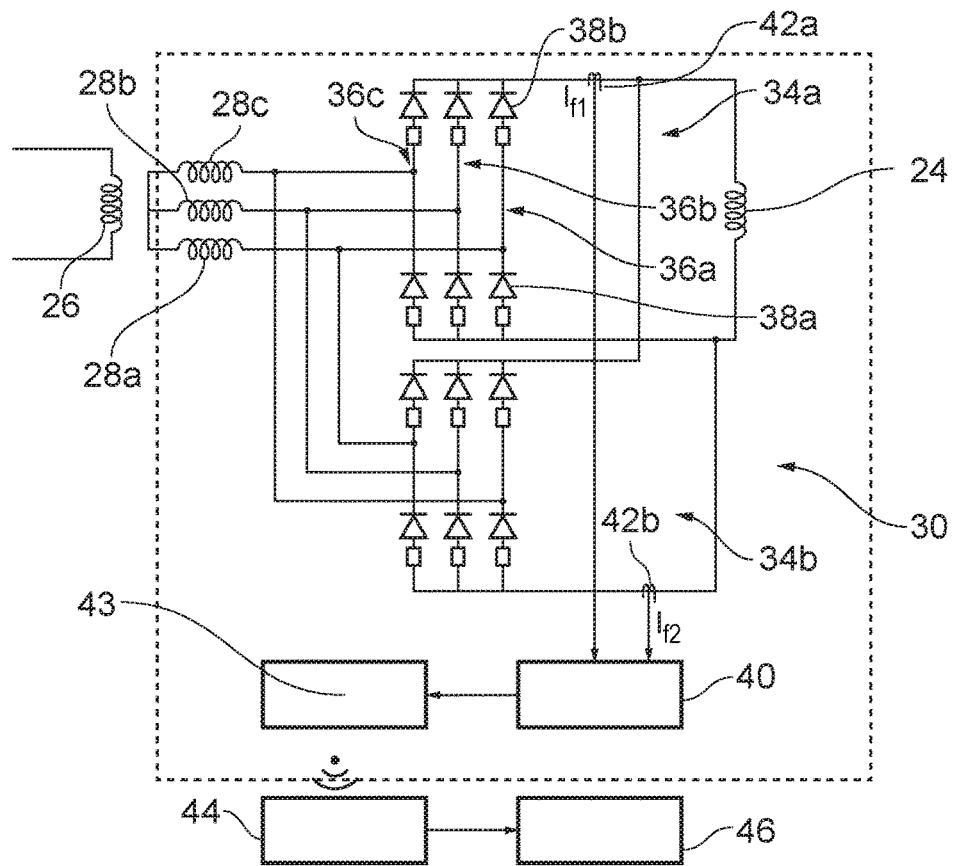
FIG. 2 is an electrical schematic of an electrical machine rectifier diode failure detection apparatus for the electrical machine of FIG. 1.

With reference to FIGS. 1 and 2, a brushless synchronous electrical machine in the form of a generator 10 is shown. It will be understood that a similar arrangement could be employed to provide DC power to a rotor main field winding when the electrical machine is operated as a motor. The generator 10 comprises an output stator 12 having a plurality of stator windings arranged in multiple phases (in the embodiment shown, the stator 12 has three phases), and a main generator rotor 14 comprising rotor main field windings 24 energised by an exciter 16. The exciter 16 in turn comprises an exciter stator 18 comprising exciter field windings 26, and an exciter rotor 20 comprising a plurality of armature windings 28a-c which are arranged in three-phase. The generator and exciter rotors 14, 20 are coupled by a common shaft 22 which is rotated by a prime mover such as a gas turbine engine, wind turbine etc. In use, the exciter stator windings 26 are provided with DC input power from, for example, a further electrical generator which is rectified and used to supply the field circuit of the exciter (not shown). Alternatively, a DC power source such as a battery could initially be used. This DC input power is electromagnetically transferred to the armature windings 28a-c across an air gap. AC power is induced in the armature windings 28a-c, since these windings are rotating relative to the exciter stator windings 26. The AC power in the armature coils 28a-c is rectified to DC power by a rectifier device 30 (described in further detail below), which rotates with the main rotor 14 and provides DC input power to the main field windings 24. The main field windings 24 thereby provide a rotating magnetic field (in view of rotation of the shaft 22), which energises the main generator stator windings, to thereby provide output power to a load (not shown). Output voltage is controlled by controlling the input voltage to the exciter field windings 26, to thereby control magnetic field strength of the main rotor windings 24. This can be achieved by, for example, an Automatic Voltage Regulator (AVR) 32 which monitors main stator output voltage and regulates exciter stator 18 input voltage accordingly.

Referring to FIG. 2, the rectifier device 30 comprises first and second rectifiers 34a, 34b. Each rectifier 34a, 34b comprises first, second and third rectifier bridges 36a-c coupled to a respective armature winding 28a-c, and to the main rotor winding 24. Each rectifier bridge 36a-c comprises first and second diodes 38a, 38b. Each diode pair 38a, 38b of each rectifier bridge 36a-c of each rectifier 34a, 34b is coupled to a respective armature winding 28a-c. The anode of the first diode 38a is coupled to the respective armature winding 28a-c, and the cathode of the second diode 38b is coupled to the respective armature winding 28a-c, with the main rotor winding 24 completing the circuit. Consequently, twelve diodes are provided in total, with each phase of the armature windings 28a-c being coupled to independent, parallel first and second rectifiers 34a, 34b. This provides redundancy, such that when one of the diodes 38 fails, either open circuit or short circuit, the rectifier device can continue to operate without interruption, and without any control inputs.

The generator 10 further comprises a control arrangement comprising a controller 40. The controller 40 is electrically coupled to sensors 42a, 42b which are in turn electrically coupled to each of the first and second rectifiers 34a, 34b to thereby sense the output current $I_{f1}$, $I_{f2}$ of each rectifier 34a, 34b respectively. One of the sensors 42a, 42b is located at a common cathode side (i.e. in electrical communication with the cathode sides of each of the diodes 38b of one of the first and second rectifiers 34a, 34b), while the other of the sensors 42a, 42b is located at a common anode side (i.e. in electrical communication with the anode sides of each of the diodes 38a of the other of the first and second rectifiers 34a, 34b). These current readings are processed by the controller 40 as follows, with reference to FIG. 3.

In a first step, DC current of each rectifier 34a, 34b output $I_{f1}$, $I_{f2}$ is measured by the sensors 42a, 42b respectively.

In a second step, the controller 40 conducts a Fourier analysis of the DC currents $I_{f1}$, $I_{f2}$ to determine magnitudes $A_k$ of $n^{th}$ harmonic components of the currents $I_{f1}$, $I_{f2}$. In the current example, the $6^{th}$ harmonics are calculated, though it will be understood that in general, the $1^{st}$ or greater harmonics could be used by the controller 40. In one further example, the $3^{rd}$ harmonic is used. A ratio $R_n$ of the magnitude $A_k$ of the nth harmonic of the first rectifier current $I_{f1}$ to the magnitude $A_k$ of the nth harmonic of the second rectifier current $I_{f2}$ is then calculated.

A Fourier analysis comprises using a Fourier transform to decompose a signal into a sum of sines and cosines of different frequencies, which sum to reproduce the original signal. The Fourier transform effectively transforms a signal from a time domain to the frequency domain. Computerised Fourier analysis tools are widely available using software such as Matlab™, which utilise methods such as Fast Fourier Transform (FFT) and Discrete Fourier Transform (DFT).

In an analysis of a multi-phase electrical system, there will generally be three-independent components: positive sequence currents, negative sequence currents and zero sequence currents. Positive sequence currents are supplied by the exciter armature winding within the exciter rotating rectifier system and are always present during operation. A second set of balanced phasors are present, which are equal in magnitude and displaced 120 degrees apart from the positive sequence currents, but display a counter-clockwise rotation sequence, which represents a negative sequence. The final set of balanced phasors is equal in magnitude and in phase with each other, however since there is no rotation sequence, this is known as a zero sequence. Further detail regarding positive, negative and zero-sequence currents is described in the textbook J. Lewis Blackburn *Symmetrical Components for Power Systems Engineering*, Marcel Dekker, New York (1993), incorporated herein by reference.

In a third, optional step, the magnitude $A_0$ of the DC component of the current $I_{f1}$, $I_{f2}$ of each rectifier 34a, 34b is also calculated from the Fourier analysis carried out in the second step, and a ratio $R_{DC}$ of the DC magnitude $A_0$ of the first rectifier current $I_{f1}$ to the DC magnitude $A_0$ of the second rectifier current $I_{f2}$ is then calculated.

In a fourth step, a comparison is made between the ratio $R_n$ and a predetermined threshold level, which in this embodiment is equal to unity (1). If the ratio $R_n$ is greater than the threshold, then a determination is made that one of the twelve diodes of the first and second rectifiers 34a, 34b is faulty. Otherwise, the controller 40 determines that all twelve diodes 38 are operating normally. If the diodes 38 are determined to be operating normally, the controller 40 loops rounds to the first step, and continues to monitor the state of the rectifiers 34a, 34b.

If one of the diodes 38 is found to be faulty, a fifth step may optionally be performed. In the fifth step, the ratio of the DC component $R_{DC}$ of the first and second rectifiers 34a, 34b is compared to a threshold value, which is again unity in this example. If the ratio $R_{DC}$ is found to be greater than 1 for a predetermined period of time, then the controller 40 determines that the diode failure has occurred in the second rectifier 34b, whereas if the ratio $R_{DC}$ is found to be less than 1 for a predetermined period of time, then the controller 40 determines that the diode failure has occurred in the first rectifier 34a. In one example, the predetermined time is approximately 2 seconds, though it will be understood that the predetermined period will vary depending on the specifics of the circuit.

In the case that a diode failure is identified, then the controller 40 provides a failure indication (which may optionally include an indication of which rectifier 34a, 34b has failed) to a wireless transmitter 43. This may be necessary since the controller 40 is coupled to the rotating main rotor 14, and so providing a signal to an external device would otherwise require a slip ring or brush, which would be susceptible to wear. The transmitter 43 transmits failure data, which is received by a suitable receiver 44. The receiver 44 in turn outputs the data to a user interface 46, which may be as simple as an LED providing a visual indication that a rectifier has failed, or could be part of a larger monitoring system.

Consequently, action may be taken, such as maintenance being performed or scheduled, as a consequence of the identification of a failure of one of the rectifiers 34a, 34b. Since the particular failed rectifier has been identified, the maintenance can be targeted to the failed rectifier 34a, 34b. Alternatively, where both rectifiers are provided as a single module, the whole rectifier device 30 could be replaced.

It will be understood that the invention is not limited to the embodiment above-described and various modifications and improvements can be made without departing from the concepts described herein. Except where mutually exclusive, any of the features may be employed separately or in combination with any other features and the disclosure extends to and includes all combinations and sub-combinations of one or more features described herein.

Figure 3:
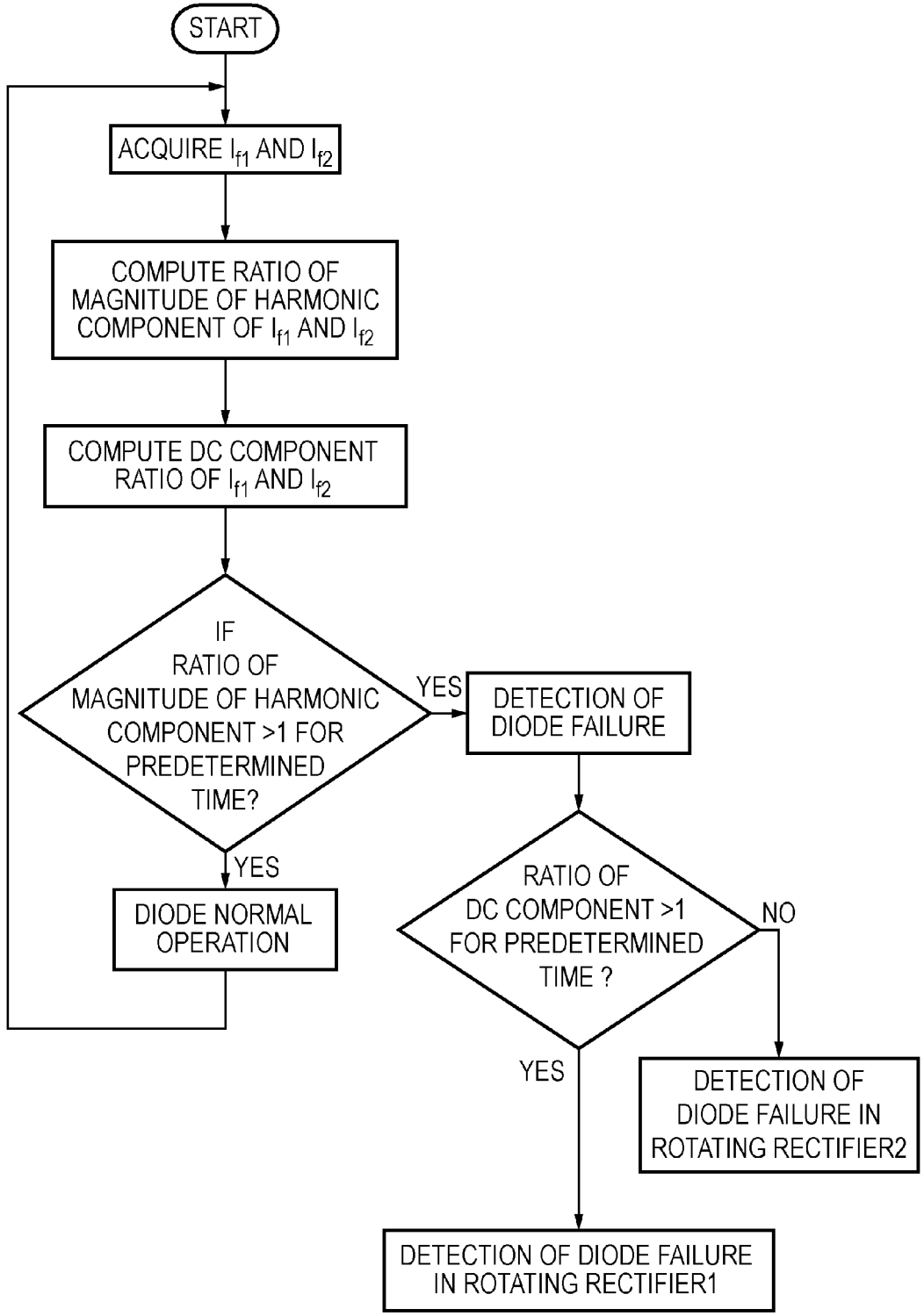
FIG. 3 is a flow diagram illustrating a method of detecting failure of a diode rectifier of the electrical machine of FIG. 1 using the apparatus of FIG. 2.

For example, it will be understood that the steps carried out by the controllers in any of the processes describes in FIG. 3 could be carried out in a different order where appropriate, and some of the steps could be carried out simultaneously with others. Further parallel redundant rectifiers could be provided, and further sensors may be provided for these further rectifiers. The detection apparatus of the present invention could be applied to an electric motor. The generator/motor could be used for land based, marine or aerospace power generation.

It will be understood that the nomenclature of the first and second sensors could be reverse, in which case the ratio of the magnitude of the first and second output current harmonics would be less than the threshold value in the event of a fault.

The invention claimed is:

1. A rectifier diode failure detection apparatus for an electrical machine, the electrical machine comprising an exciter armature winding, a rotor main field winding and first and second rectifiers arranged in parallel, each rectifier comprising at least two rectifier diodes, each rectifier being configured to independently supply the rotor main field winding with DC electrical current, the rectifier diode failure detection apparatus comprising:

a controller comprising at least two current sensors, each current sensor being configured to measure output current of a respective one of the rectifiers, and the controller being configured to determine a harmonic of the measured rectifier output currents, the controller being further configured to determine a ratio of a magnitude of the first rectifier output current harmonic to a magnitude of the second rectifier output current harmonic, wherein the controller is configured to determine that a fault has occurred in one of the rectifier diodes where the ratio is not equal to a threshold value.

2. An apparatus according to claim 1, wherein the measured harmonic of each rectifier output current comprises any of the fundamental higher harmonics.

3. An apparatus according to claim 2, wherein the measured harmonic of each rectifier output current comprises one of the third harmonic and the sixth harmonic.

4. An apparatus according to claim 1, wherein the controller further comprises a wireless transmitter configured to transmit a failure indication to a wireless receiver located remotely from the first and second rectifiers.

5. An apparatus according to claim 1, wherein the controller is further configured to determine a ratio of a magnitude of a DC component of the first rectifier output current to a magnitude of a DC component of the second rectifier output current, and to determine that a rectifier diode of the second rectifier has failed where the ratio is greater than unity for a predetermined period of time, and that a rectifier diode of the first rectifier has failed where the ratio is less than unity for a predetermined period of time.

6. An apparatus according to claim 1, wherein a first current sensor is coupled to an anode side of diode bridges of the first rectifier, while a second current sensor is coupled to a cathode side of diode bridges of the second rectifier.

7. A method of determining failure of an electrical machine rectifier diode, the electrical machine comprising an exciter armature winding, a rotor main field winding and first and second rectifiers arranged in parallel, each rectifier comprising at least two rectifier diodes, each rectifier being configured to independently supply the rotor main field winding with DC electrical current, the method comprising:

measuring output current of each of the rectifiers, determining a harmonic of each rectifier output current; and determining a ratio of a magnitude of the first rectifier output current harmonic to a magnitude of the second rectifier output current harmonic, wherein the method comprises determining that a fault has occurred in one of the rectifier diodes where the ratio is not equal to a threshold value.

8. A method according to claim 7, wherein the method further comprises determining a ratio of a magnitude of a DC component of the first rectifier output current to a magnitude of a DC component of the second rectifier output current, and determining that the second rectifier has failed where the ratio is greater than unity for a predetermined period of time, and that the first rectifier has failed where the ratio is less than unity for a predetermined period of time.

* * * * *